United States Patent [19]

Kudo et al.

[11] Patent Number: 5,031,024
[45] Date of Patent: Jul. 9, 1991

[54] RESIN SEALING TYPE SEMICONDUCTOR DEVICE HAVING OUTER LEADS DESIGNED FOR MULTI-FUNCTIONS

[75] Inventors: Yoshimasa Kudo, Yokohama; Shinjiro Kojima, Chigasaki, both of Japan

[73] Assignee: Kabushiki Kaisha Toshiba, Kawasaki, Japan

[21] Appl. No.: 576,936

[22] Filed: Sep. 4, 1990

[30] Foreign Application Priority Data

Sep. 5, 1989 [JP] Japan .................................. 1-230070

[51] Int. Cl.⁵ ..................... H01L 23/48; H01L 23/50
[52] U.S. Cl. ........................................ 357/72; 357/70; 357/74
[58] Field of Search ................... 357/70, 69, 72, 74

[56] References Cited

U.S. PATENT DOCUMENTS

| 4,697,203 | 9/1987 | Sakai et al. | 357/72 |
| 4,907,129 | 3/1990 | Shimizu | 357/70 |

FOREIGN PATENT DOCUMENTS

| 0258098 | 2/1988 | European Pat. Off. . | |
| 59-033838 | 2/1984 | Japan . | |
| 59-115551 | 7/1984 | Japan . | |
| 60-107848 | 6/1985 | Japan | 70/ |
| 63-318131 | 12/1988 | Japan . | |
| 1-216565 | 8/1989 | Japan | 70/ |
| 2115607A | 9/1983 | United Kingdom . | |

*Primary Examiner*—Rolf Hille
*Assistant Examiner*—S. V. Clark
*Attorney, Agent, or Firm*—Finnegan, Henderson, Farabow, Garrett and Dunner

[57] ABSTRACT

A resin sealing type semiconductor apparatus includes semiconductor devices having electrodes. A plurality of leads include inner leads and outer leads, the former connected to the electrodes of the semiconductor devices by thin metal wires. A sealing resin layer covers at least the semiconductor devices and the inner leads. The outer leads, which are led out in one direction from the sealing resin layer, have two different types or more of pitches, the number of the pitches of each type being two or greater.

8 Claims, 5 Drawing Sheets

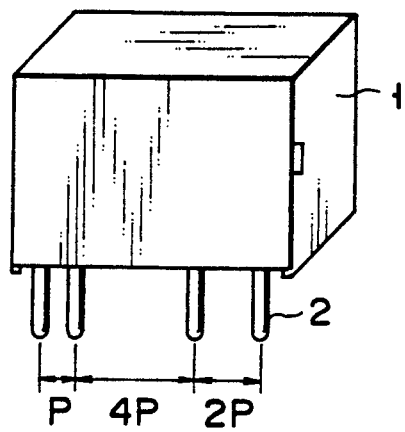
(PRIOR ART)
F I G. 1
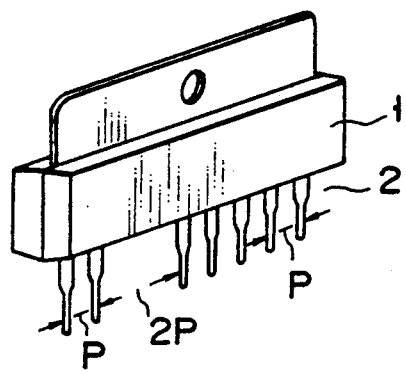
(PRIOR ART)
F I G. 2

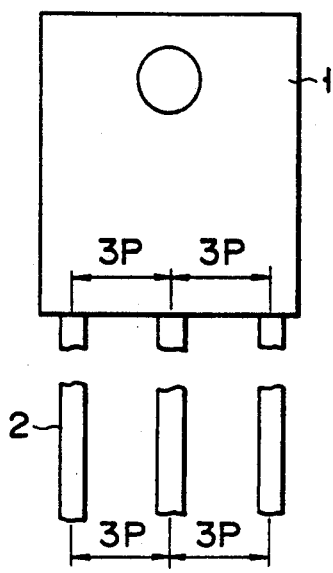
(PRIOR ART)
F I G. 3A
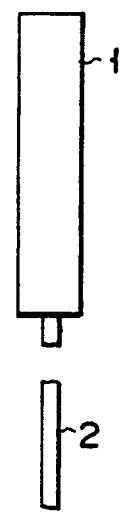
(PRIOR ART)
F I G. 3B
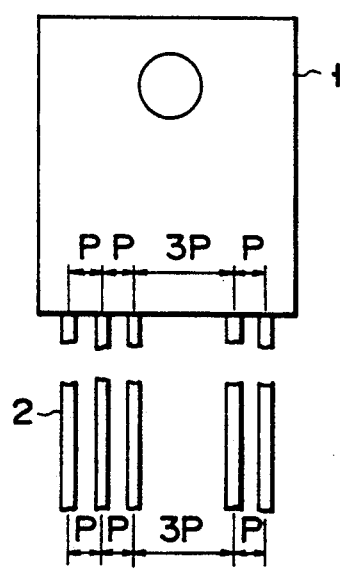
(PRIOR ART)
F I G. 4A
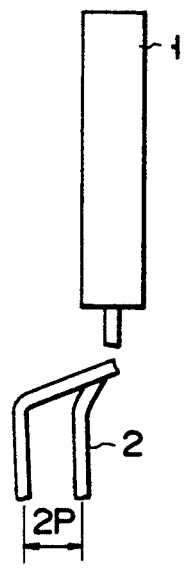
(PRIOR ART)
F I G. 4B

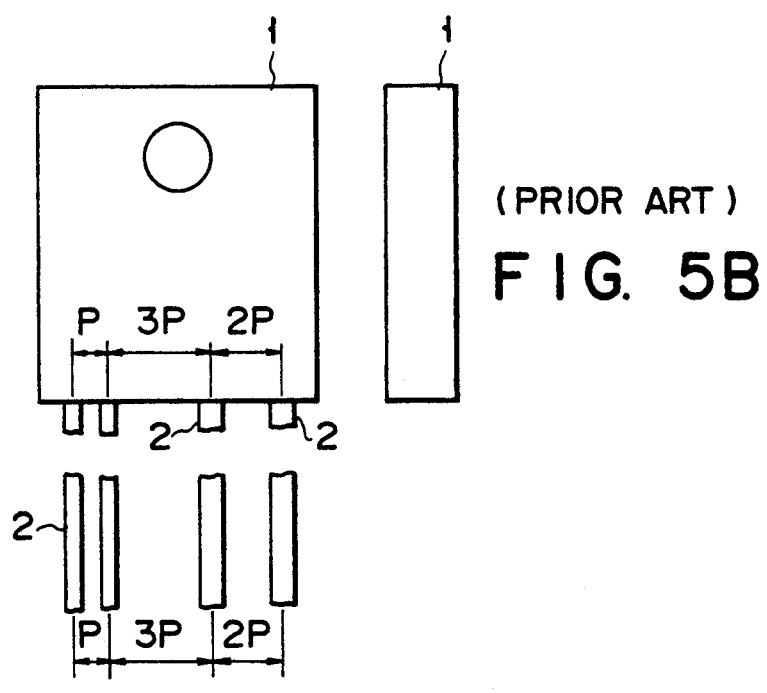
(PRIOR ART)
FIG. 5B
(PRIOR ART)
FIG. 5A

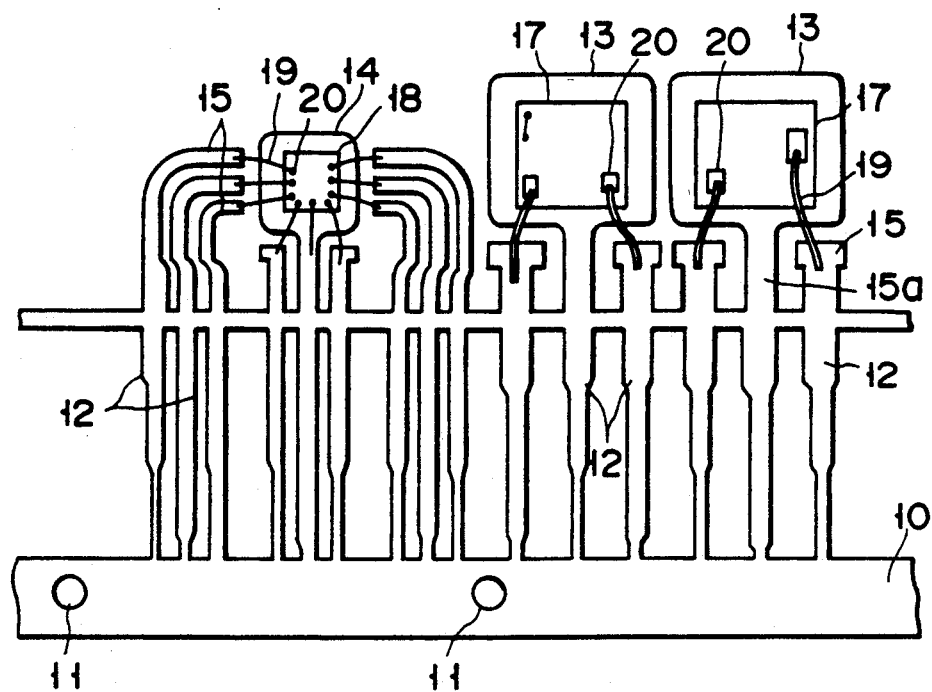
FIG. 6
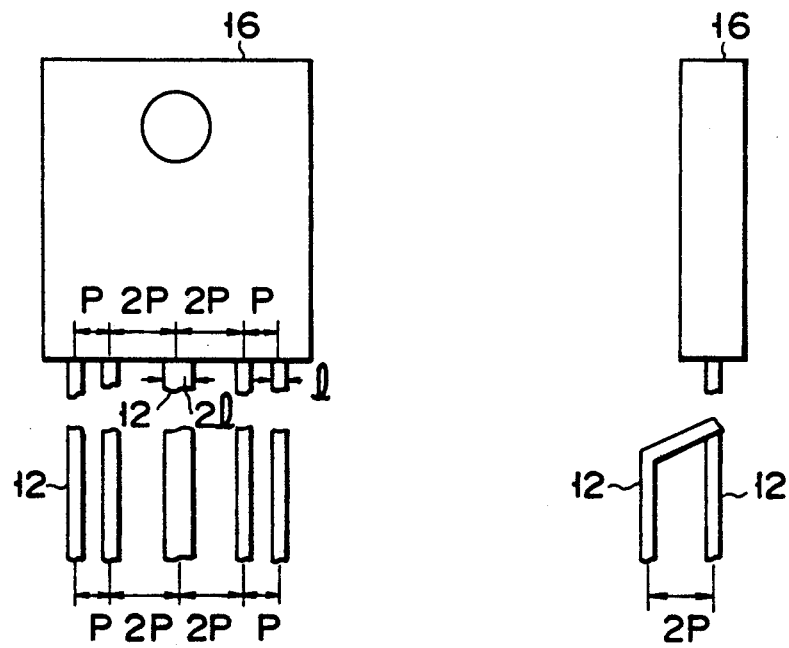
FIG. 7A　　FIG. 7B

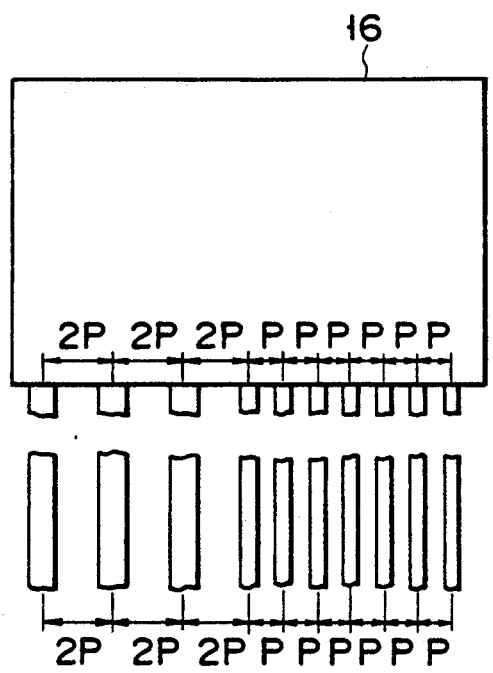 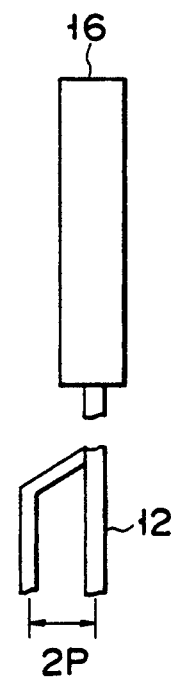
FIG. 8A   FIG. 8B

RESIN SEALING TYPE SEMICONDUCTOR DEVICE HAVING OUTER LEADS DESIGNED FOR MULTI-FUNCTIONS

BACKGROUND OF THE INVENTION

1. Field of the Invention

The present invention relates to a resin sealing type semiconductor apparatus in which a power transistor or power IC having large power or generating a large amount of heat at the time of operation is installed. More particularly, this invention relates to outer leads of a semiconductor apparatus.

2. Description of the Related Art

Conventionally, products having many electronic parts mounted in a hybrid type on a printed circuit board have been used. Recently, there are module products on the market which have electronic parts including semiconductor devices installed in a lead frame system. The module products us SIP (Single In Line Package) type lead frames and a wide variety of electronic parts can be installed on each product.

In a module product assembled as resin sealing type semiconductor apparatus by using an SIP type lead frame, inner leads formed on the SIP lead frame by subjecting this frame to a resin sealing step through the transfer mold method are led out from the sealing resin layer, so that the led-out portions of the inner leads serve as outer leads. (Hereinafter, the sealing resin layer including these outer leads will be called "package.")

When a semiconductor device that has large power or generates a large amount of heat at the time of operation, i.e., a power transistor or power IC is used as in the above case, the dielectric strength should be considered. As shown in FIG. 1, a pitch P, 2P and 4P is the distance between the leads. A typical measure against the dielectric strength is to increase the pitches between the outer leads while making the remaining pitches the same. Alternatively, there is a type which has one pitch between leads increased or a type which has three different pitches between leads.

FIGS. 1 through 5B exemplify the above three prior art devices.

FIG. 1 is a perspective view of a photocoupler which performs a zero cross function and has three different pitches, the smallest, reference pitch P and its integer-multiple pitches 2P and 4P between outer leads 2 led out from a sealing resin layer 1. FIG. 2 exemplifies a type having two pitches, P and 2P, between outer leads 2 which are characterized in that their free ends have a smaller diameter. FIGS. 3 to 5B illustrate other examples. As described above, a resin sealing type semiconductor apparatus requires that the pitches between outer leads be increased in light of the dielectric strength necessary for the power element installed in the package and that the pitches between outer leads of other semiconductor apparatuses constituting a power element control section should also be increased. Further, with an SIP type lead frame in use, the outer leads are led out from one direction.

The number of outer leads and the pitches between the leads are restricted by the size of the package, thus hindering realization of multi-functions (multi-pins) of the resin sealing type semiconductor apparatus. With an SIP lead frame in use, mounted semiconductor devices are supported by the inner leads alone. When the strength of the inner leads or outer leads is not strong, the leads may deform during assembling of the apparatus.

SUMMARY OF THE INVENTION

It is therefore an object of the present invention to provide a resin sealing type semiconductor apparatus designed to permit multi-pins to be formed on a package of a limited size, i.e., to ensure a multi-function module product.

To achieve this object, according to the present invention, there is provided a resin sealing type semiconductor apparatus comprising:

semiconductor devices each having electrodes;

a plurality of leads including inner leads and outer leads, the inner leads being connected to the electrodes of the semiconductor devices; and a sealing resin layer for sealing at least the semiconductor devices and the inner leads, the outer leads being led out in one direction from the sealing resin layer and having two or more different pitches therebetween, each different pitch appearing at least two times.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 1 and 2 are perspective views illustrating the essential portions of conventional resin sealing type semiconductor apparatuses, respectively;

FIGS. 3A and 3B, 4A and 4B, and 5A and 5B are respectively front and side views of other prior art resin sealing type semiconductor apparatuses;

FIG. 6 is a diagram illustrating a lead frame pattern according to one embodiment of the present invention; and FIGS. 7A and 7B and 8A and 8B are respectively front and side views of resin sealing type semiconductor apparatuses embodying the present invention.

DETAILED DESCRIPTION OF THE PREFERRED EMBODIMENTS

To begin with, a brief description of the present invention will be given below.

A module product is provided by installing on a printed circuit board a resin sealing type semiconductor apparatus which has electronic parts, including a power element that needs a dielectric strength, mounted on its lead frame. Since the size of the printed circuit board is determined by a machine in use, the printed circuit board is assumed to have a specific area. Accordingly, it is necessary to select the lead frame used in assembling resin sealing type semiconductor apparatus in light of the mounting or package density on the printed circuit board having a specific area. A resin sealing type semiconductor apparatus according to the present invention employs an SIP type lead frame which has outer leads led out in one direction from a sealing resin layer for the following reason. The outer leads mounted on the surface of the printed circuit board are fitted in through holes formed in a row on the printed circuit board, so that the plane area can be reduced as compared with the one utilizing a DIP (Dual In Line Package) type lead frame. In addition, the resin sealing type semiconductor apparatus according to the present invention is designed to allow a power element besides a control IC to be mounted.

More specifically, the pitches between outer leads of a semiconductor device in which a relatively low current flows, such as a control IC, are made smallest, P, and the pitches between outer leads for a power element are consecutively made an integer-multiple of the smallest pith P, and the leads that support a bed on which the power element is mounted are made wider than the other leads, thus preventing deformation of the apparatus during assembling as well as improving the heat-generating performance.

One embodiment of the present invention will now be described referring to FIGS. 6 through 8B. According to a resin sealing type semiconductor apparatus embodying the present invention, electronic circuits including a power element that should have a dielectric strength are constituted in an assembling step utilizing a lead frame. A module product is provided by a mounting system that mounts outer leads, led out from a package made of a sealing resin, on a printed circuit board. In the assembling step, a so-called SIP type lead frame is used, which will be described below. It is typical to form a lead frame having a specific pattern by subjecting a copper or copper alloy plate to a stamping process. The stamping process is not, however, essential, and may be replaced with an etching step. According to the SIP type lead frame, a plurality of inner leads are provided on the frame, and beds are formed on free ends of some of the inner leads.

As shown in FIG. 6, through holes 11 are formed in a metal frame 10 to receive alignment pins (not shown) at the time the lead frame is conveyed, and inner leads 15 and 15a are formed relatively wider to improve the mechanical strength as well as the current capacity and heat-generating performance. The inner lead 15a is connected to a bed 13 having a relatively large area, and a power element 17, such as a Darlington transistor, is mounted on the bed 13.

The free ends of the thinnest inner leads 15 are collected to be floating ends at the proximity of a bed 14 which has a smaller area than the bed 13 and on which, for example, a control IC 18 is to be mounted. After predetermined semiconductor devices 17 and 18 are mounted on the respective beds, electrodes 20 formed on the semiconductor devices are electrically connected to the inner leads 15 by means of thin metal wires 19 made of a metal selected from a group of gold, Al and copper (copper alloy allowable). The electrical connection is made by, for example, well-known wire ball bonding method or ultrasonic bonding method by which the electrodes 20 and inner leads 15 are connected by the thin metal wires 19 made to form predetermined loci and form loops of predetermined heights. In this process, after the balls formed at the distal ends of the thin metal wires 19 are bonded through thermocompression bonding to the electrodes 20 formed on the semiconductor devices 17 and 18, the free ends of the thin metal wires 19 having predetermined loops are bonded to the inner leads 15 by the Wedge method to provide electric connection therebetween.

A lead frame made of copper or copper alloy having a high thermal conductance is preferable for the power element 17 that generates a large amount of heat, and the lead frame has a thickness of 0.4 to 0.8 mm. As should be apparent from FIGS. 7A to 8B, outer leads 12 of such an SIP type lead frame are made to have the smallest pitch P=1.27 mm and its integer-multiple 2P (2.54 mm) or 3P (3.81 mm), with the pitch P, 2P or 3P being repeated two or more times. Each pitch, which does occur in the device outer leads 12, occurs at least twice.

Further, as shown in FIG. 7A, the inner lead 15a for supporting the bed 13 on which the power element 17 is to be mounted is formed to have a width 21 (e.g., 2 mm) nearly double the width 1 of the other inner leads 15, and those of the outer leads 12 which have the pitch of 1.27 mm are formed in a zigzag to be fitted in the through holes formed in the printed circuit board or be mounted thereon. Two outer leads 12 with the pitch 2P are provided in FIG. 7A, whereas two or more outer leads 12 with the pitches P and 2P are provided in FIG. 8A.

FIGS. 7A, 7B, 8A and 8B illustrate packages acquired through a resin sealing step conducted by the well-known transfer mold method after the above mounting step is completed. FIGS. 7A and 8A are front views, and FIGS. 7B and 8B side views.

The illustrated packages are the products after removing the unnecessary lead frame portion, forming the outer leads and checking bending of leads. FIGS. 7B and 8B, side views, clearly show the outer leads 12 formed zigzag.

FIGS. 7A to 8B each illustrate a package having the outer leads 12 led out in one direction from the sealing resin layer 16, omitting a plurality of beds shown in FIG. 6; actually, the power element 17 that generates a large amount of heat is mounted on the bed 13.

Through the above-described processes, a resin sealing type semiconductor apparatus is completed which satisfies the measures legally required for the dielectric strength.

Such a resin sealing type semiconductor apparatus has a combination of a power element 17 and a control IC 18, and can be applied to a module product as a semiconductor apparatus with a small area.

The outer leads with the smallest pitch P=1.27 mm are formed zigzag when mounted on a printed circuit board, so that the pitches between the outer leads become equal to the standard pitches of a lead pin inserting type which are formed to match the inserting pitch of 2.54 mm of the printed circuit board. This resin sealing type semiconductor apparatus can therefore easily be mounted on the printed circuit board.

Further, since the width of the inner leads that support beds on which power elements are to be mounted are increased to prevent deformation of the apparatus, the yield in the fabricating process is improved and the resultant resin sealing type semiconductor apparatus has an excellent heat-generating performance.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A resin sealing type semiconductor apparatus comprising:
   semiconductor devices each having electrodes;
   a plurality of leads including inner leads and outer leads electrically connected to the inner leads, each of said leads being separated from an adjacent lead by one of a plurality of pitches and said inner leads being connected to said electrodes of said semiconductor devices by metal wires;

a sealing resin layer for sealing said semiconductor devices and said inner leads, said outer leads being led out in one direction from said sealing resin layer;

said plurality of pitches comprising a first pitch and a second pitch, said first and second pitches being different, and each of said first and second pitches occurring at least twice.

2. A resin sealing type semiconductor apparatus according to claim 1, wherein similar length pitches occur consecutively.

3. A resin sealing type semiconductor apparatus according to claim 1, wherein only said first pitches occur consecutively.

4. A resin sealing type semiconductor apparatus according to claim 1, wherein with the smallest one of pitches of said outer leads being P, other pitches can be expressed by an integer-multiple of P.

5. A resin sealing type semiconductor apparatus according to claim 4, wherein said smallest pitch P is approximately 1.27 mm.

6. A resin sealing type semiconductor apparatus according to claim 1, wherein some of said inner leads have a width approximately twice as large as that of the other inner leads.

7. A resin sealing type semiconductor apparatus according to claim 1, wherein those of said outer leads which are separated by said first pitch are arranged zigzag.

8. A resin sealing type semiconductor apparatus according to claim 7, wherein said first pitch is 1.27 mm.

* * * * *